United States Patent [19]

McAdams

[11] Patent Number: 4,716,320
[45] Date of Patent: Dec. 29, 1987

[54] CMOS SENSE AMPLIFIER WITH ISOLATED SENSING NODES

[75] Inventor: Hugh P. McAdams, Houston, Tex.

[73] Assignee: Texas Instruments Incorporated, Dallas, Tex.

[21] Appl. No.: 876,624

[22] Filed: Jun. 20, 1986

[51] Int. Cl.⁴ .................... H03K 3/356; H03K 17/04
[52] U.S. Cl. .................................. 307/530; 307/443; 307/496; 307/350; 365/205
[58] Field of Search ............... 307/443, 448, 452, 496, 307/350, 530, 279, 291, 246; 365/202, 205, 208

[56] References Cited

U.S. PATENT DOCUMENTS

| 3,882,326 | 5/1975 | Kruggel | 307/530 |
|---|---|---|---|
| 4,031,522 | 6/1977 | Reed et al. | 307/530 |
| 4,169,233 | 9/1979 | Haraszti | 307/279 X |
| 4,274,013 | 6/1981 | Clemons et al. | 307/279 X |
| 4,521,703 | 6/1985 | Dingwall | 307/530 |

OTHER PUBLICATIONS

Towler, "Low Input Capacitance Sense Amplifier", IBM T.D.B., vol. 26, No. 7A, Dec. 1983, pp. 3124–3125.
Boysel et al, "Multiphase Clocking Achieves 100–Nsec MOS Memory", Electronic Design News, Jun. 10, 1968, pp. 50–54.
Chin et al, "Sense Latch for One–Device Memory Cell", IBM T.D.B., vol. 15, No. 11, Apr. 1973, pp. 3379–3380.

Gschwendtner et al, "Sense System", IBM T.D.B., vol. 16, No. 12, May 1974, pp. 3960–3961.

Primary Examiner—Stanley D. Miller
Assistant Examiner—D. R. Hudspeth
Attorney, Agent, or Firm—Rodney M. Anderson

[57] ABSTRACT

A CMOS sense amplifier is disclosed which has the capacitance of the bit lines isolated from the sensing nodes, which allows the sensed differential voltage to be amplified faster than in current CMOS sense amplifiers, since the sensing nodes have significantly lower capacitance than the bit lines. The isolation is achieved by connecting the bit lines to only the gates of the upper transistors of the cross-coupled inverters, and by coupling the gates of the lower transistors to the common nodes of the inverters (i.e., the sensing nodes of the sense amplifier). In this way, the bit line voltages causes the cross-coupled inverters to begin switching based on the upper transistor of the inverter coupled to the bit line with the lower voltage being more conductive than the upper transistor of the other inverter; the cross-coupled arrangement of the lower transistor gates to the sensing nodes causes the required amplification and latching action. The bit lines are restored by means of an additional CMOS inverter, for each bit line, where the input of the inverter is connected to the sensing node, and its output is connected to the bit line. Once the differential voltage is amplified at the sensing nodes, the additional inverters drive the bit lines in order to restore the sensed data state at the storage cell.

16 Claims, 4 Drawing Figures

CMOS SENSE AMPLIFIER WITH ISOLATED SENSING NODES

This invention relates to semiconductor integrated circuits, and more particularly to an improved sense amplifier for dynamic read/write memory devices.

BACKGROUND OF THE INVENTION

In dynamic random access memories (DRAMs) constructed as generally shown in U.S. Pat. No. 4,081,701 (a 16 kbit DRAM) issued to White, McAdams and Redwine and assigned to Texas Instruments, Inc., and in U.S. Pat. No. 4,293,993 (a 64 kbit DRAM) issued to McAlexander, White and Rao and assigned to Texas Instruments, Inc., data is stored in a plurality of memory cells arranged in rows and columns, each storage cell consisting of a single capacitor, and the stored data state represented by either the presence or absence of charge stored by the capacitor. In such devices, differential sense amplifiers are used to sense the data state of an addressed cell by comparing the voltage on the storage capacitor to the voltage on a reference, or dummy, capacitor designed to store charge in such a manner as to represent, to the sense amp, a voltage between a "1" data state and a "0" data state stored on the storage capacitor. The charge stored on the storage and dummy cells induce voltages at the sense amp via conductors which are commonly called bit lines; sensing occurs as one plate of the storage cell capacitor is connected to the bit line at one side of the sense amplifier, and one plate of the dummy cell capacitor is connected to the bit line at the other side of the sense amplifier. Upon sensing the differential voltage between the two bit lines, representative of the differential stored charge between the storage and dummy cell capacitors, the sense amplifier then amplifies the differential voltage to a level detectable by the remainder of the memory circuit, and also restores charge to the storage cell reprsentative of the sensed data state via the bit line connected to the addressed storage cell.

It is desirable to use complementary-metal-oxide-semiconductor (CMOS) technology in the peripheral circuitry of a DRAM for many reasons, including reduction of power cosumption by the device. Accordingly, CMOS sense amplifiers have been designed for use in DRAM devices, as disclosed in U.S. Pat. No. 4,555,777 issued Nov. 26, 1985 and assigned to Texas Instruments, Inc., and as disclosed in copending application Ser. No. 636,938, filed Aug. 2, 1984 by C. Duvury and assigned to Texas Instruments, Inc. Heretofore, CMOS sense amplifier circuits have consisted primarily of a cross-coupled pair of CMOS inverters, with a first sensing node, i.e., the gates of the transistors of one of the inverters, connected to the bit line associated with the storage cell capacitor and also connected to the output of the second inverter, and with a second sensing node, i.e., the gates of the transistors of the second inverter, connected to the bit line associated with the dummy cell and also connected to the output of the first inverter. However, the bit lines generally have a capacitance which is quite large relative to the storage and dummy cell capacitances. With the bit lines, and the capacitance associated therewith, connected to the sensing nodes of the sense amplifier, the time required to sufficiently amplify the differential voltage of the sensing nodes is dependent upon the time required to charge up these relatively large capacitances.

Therefore, it is an object of this invention to provide a CMOS sense amplifier which senses the differential voltage of the bit lines but which isolates the capacitance of the bit lines from the sensing nodes so that the sensing nodes may be amplified without the loading effect of the bit line capacitance.

It is a further object of this invention to provide a CMOS sense amplifier which has the bit line capacitance isolated from the sensing nodes but which has the bit lines driven responsive to the amplified differential voltage at the sensing nodes in order to restore data to the addressed memory cell.

SUMMARY OF THE INVENTION

The invention may be embodied in a sense amplifier circuit where the bit line to be sensed is connected to the gate of the upper transistor in a first CMOS inverter, with the output of the first CMOS inverter connected to the gate of the lower transistor of a second CMOS inverter, and where the bit line associated with the dummy cell is connected to the gate of the upper transistor in the second CMOS inverter, with the output of the second CMOS inverter connected to the gate of the lower transistor of the first CMOS inverter. As the high voltage and low voltage nodes of the CMOS inverter pair are brought to their high and low voltages, respectively, the differential voltage of the bit lines is amplified; however, since the bit lines are not connected to the outputs of the two inverters, the capacitance of the bit lines does not load the amplification of the differential voltage. Another CMOS inverter is provided, having its input connected to the output of the CMOS inverter and having its output connected to the bit line associated with the storage cell, so that the amplified differential voltage restores the original data state to the storage cell.

DETAILED DESCRIPTION OF THE PREFERRED EMBODIMENT

Figure 1:
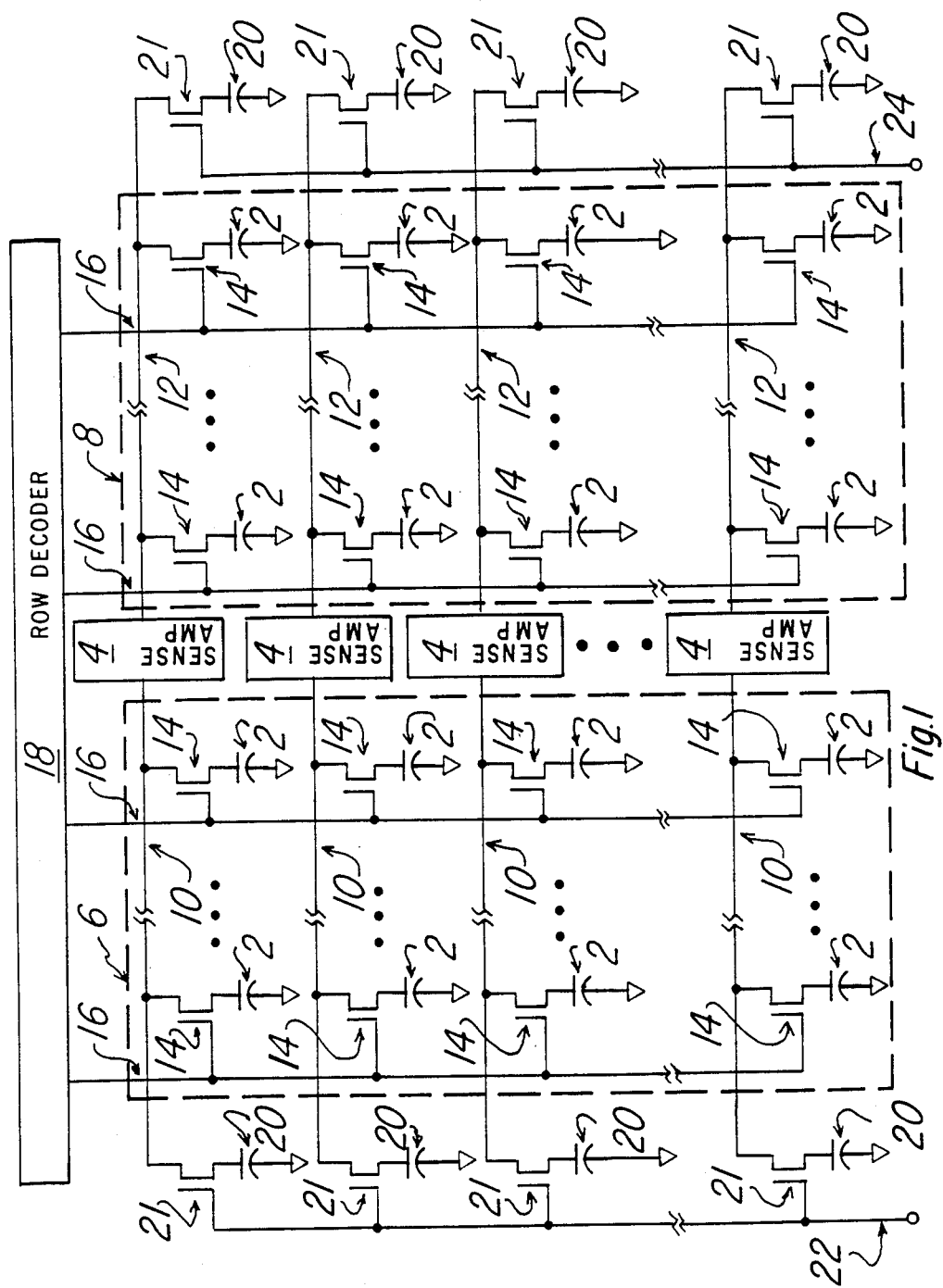
FIG. 1 is a schematic diagram of a memory device utilizing the preferred embodiment of the invention.

Referring to FIG. 1, a typical memory device containing a sense amplifier according to the invention will be described. The memory device is comprised of a plurality of storage capacitors 2, arranged in an array of rows and columns. The number of rows in a typical 256 kbit or 1 Mbit DRAM device may number 256 or 512, while the number of columns may number 1024 or 2048. Disposed in the center of the array are sense amplifiers 4, dividing the array into two halves 6 and 8. Each of the storage capacitors 2 in a given column in array half 6 are associated with bit line 10, while each of the storage capacitors 2 in a given column in array half 8 are associated with bit line 12. Associated with each column is sense amplifier 4, connected to a single bit line 10 from array half 6 and a single bit line 12 from array half 8. Each storage capacitor 2 is connectable to bit line 10 or 12 by means of transfer gate 14; each transfer gate 14 is controlled by a word line 16, with word lines 16 responsive to row decoder 18. Row decoder 18 receives a row address signal and drives a high voltage on the word line 16 corresponding to the row address signal, connecting the storage capacitors 2 associated with the selected word line 16 to bit lines 10 or 12, depending on the array half 6 or 8 containing the selected row. On each side of the array, a row of dummy capacitors 20 are disposed, connectable to bit lines 10 and 12 similarly as storage capacitors 2, via dummy transfer gates 21, responsive to dummy word lines 22 and 24. In the event a word line 16 in array half 6 is addressed via row decoder 18, for example word line 16', dummy word line 24 will be energized concurrently with selected word line 16'. Therefore, each sense amplifier 4 will be connected to each storage capacitor 2 associated with selected word line 16' via bit line 10, and to each dummy capacitor 20 via bit line 12. Each sense amplifier 4 is thus able to sense the differential voltage established by the difference in charge stored in the storage capacitor 2 and dummy capacitor 20 associated therewith, dummy capacitor 20 being designed to store an amount of charge approximately halfway between the charge constituting a "1" level and a "0" level on storage capacitor 2. In order for the memory device to output the sensed data, and to receive incoming data, input/output lines may be connected to sense amplifiers 4 in a manner well known in the art; an example of which is disclosed in U.S. Pat. No. 4,555,777 issued on Nov. 26, 1985 to K. Poteet and assigned to Texas Instruments, Inc.

It should be noted, of course, that the arrangement of storage capacitors 2, dummy capacitors 20, sense amplifiers 4, word lines 16, and bit lines 10 and 12, may vary without affecting the applicability of the invention disclosed and claimed herein. For example, the well-known folded bit line approach may be used, wherein the addressed storage capacitor 2 and dummy capacitor 20 are on the same physical side of sense amplifier 4. In addition, as disclosed in U.S. Pat. No. 4,547,868 issued Oct. 15, 1985 to Jimmie D. Childers and Adin E. Hyslop, and assigned to Texas Instruments, Inc., dummy capacitor 20 may be of the same size as storage capacitor 2, thereby storing a "full" charge relative to storage capacitor 2, but which shares its charge with another similar dummy capacitor so that sense amplifier 4 is presented with the proper reference voltage from dummy capacitor 20, approximately halfway between a "0" state and a "1" state. The operation, applicability and advantages of the invention disclosed and claimed herein are not affected by this, or other, such alternate arrangements.

Figure 2:
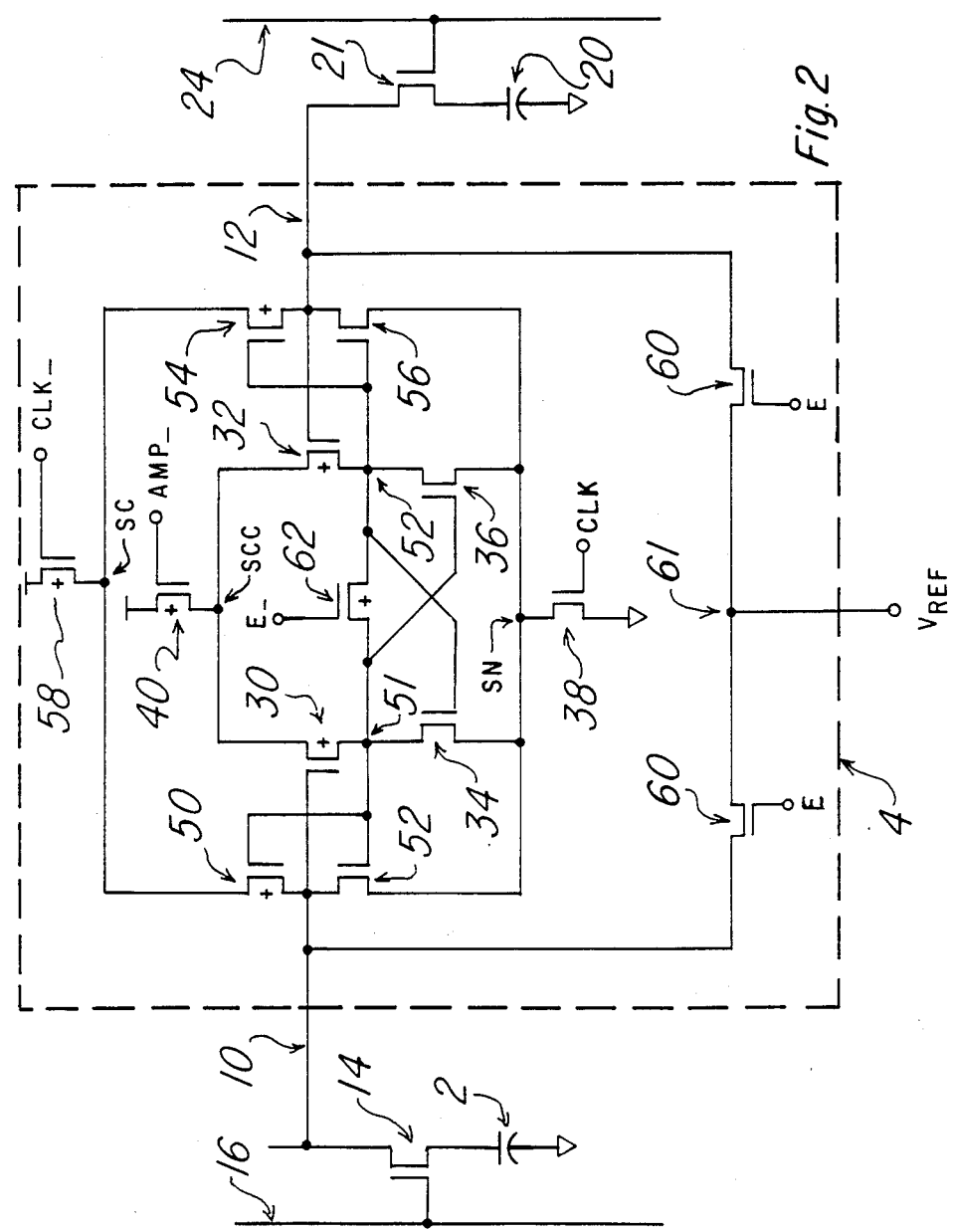
FIG. 2 is a schematic diagram of a CMOS sense amplifier constituting the preferred embodiment of the invention.

Referring now to FIG. 2, the preferred embodiment of the invention will be described in detail. For purposes of explanation, only one of the sense amplifiers 4 is shown in FIG. 2 as associated with a single storage capacitor 2 connected via bit line 10, and as associated with a dummy capacitor 20 via bit line 12; it should be understood, of course, that sense amplifier 4 is associated with additional storage capacitors 2 and an additional dummy capacitor 20 as shown in FIG. 1, and that a plurality of sense amplifiers 4 are present on the typical memory device having a plurality of columns. Bit line 10 is cnnected to the gate of p-channel transistor 30, transistor 30 having its source connected to node SCC and its drain connected to sensing node S1. Similarly, bit line 12 is connected to the gate of p-channel transistor 32, transistor 32 having its source connected to node SCC and its drain connected to sensing node S2. Sensing node S2 is connected to the gate of n-channel transistor 34, and sensing node S1 is connected to the gate of n-channel transistor 36. Since transistor 34 has its source connected to node SN and its drain connected to sensing node S1, and since transistor 36 similarly has its source connected to node SN and its drain connected to sensing node S2, the interconnection of transistors 30, 32, 34, and 36 is similar to the cross-coupling of inverters, as used in prior sense amplifiers, except that the gates of the p-channel transistors 30 and 32 are not connected to gates of their associated n-channel transistors 34 and 36, but instead are connected directly to bit lines 10 and 12, respectively. Node SN is coupled to ground via n-channel transistor 38, with the gate of transistor 38 controlled by internal clock signal CLK. Similarly, node SCC is coupled to the $V_{cc}$ power supply via p-channel transistor 40, with the gate of transistor 40 controlled by internal clock signal AMP_ (it should be noted that the_symbol after the signal designation, as in AMP_, denotes that the signal is active in its low logic state).

For purposes of restoring the sensed data onto bit lines 10 and 12, a CMOS inverter comprised of p-channel transistor 50 and n-channel transistor 52 is connected between sensing node S1 and bit line 10. As shown in FIG. 2, the gates of transistors 50 and 52 are connected to sensing node S1, the drains of transistors 50 and 52 are connected to bit line 10, the source of transistor 52 is connected to node SN, and the source of transistor 50 is connected to node SC. Similarly, a CMOS inverter comprised of p-channel transistor 54 and n-channel transistor 56 is similarly connected between sensing node S2 and bit line 12; although the charge on the dummy cells is restored using techniques well known in the art, the CMOS inverter comprised of transistors 54 and 56 is needed for restoring data to storage capacitors 2 associated with bit line 12, in the event a row in array half 8, rather than array half 6 as used in this example, is selected. Node SC is coupled to the $V_{cc}$ power supply via p-channel transistor 58, the gate of transistor 58 being controlled by clock signal CLK_.

As disclosed in U.S. Pat. No. 4,547,868, it is useful to precharge the bit lines to be at equal voltages, for example at $V_{cc}/2$, prior to the sensing operation. It is similarly useful to equalize sensing nodes S1 and S2 prior to the sensing operation; this equalization must be done independently from the equalization of bit lines 10 and 12 according to the instant invention, since sensing nodes S1 and S2 are isolated from bit lines 10 and 12. The source-to-drain paths of n-channel transistors 60 connect reference node 61 to bit line 10 and bit line 12 when the gates of transistors 60 are energized by clock signal E. Reference node 61 is set to a reference voltage $V_{ref}$, which is approximately $V_{cc}/2$, so that when clock signal E is driven to a high level, bit lines 10 and 12 will be equalized to approximately $V_{cc}/2$, as will be described below. P-channel transistor 62 has its gate controlled by clock signal E_, and its source-to-drain path connected between sensing nodes S1 and S2, for purposes of equalizing the sensing node voltages. It should be noted that, compared to the prior art, two equalization transistors 60 and 62 are required, due to the feature of the invention which isolates the capacitances of bit lines 10 and 12 from sensing nodes S1 and S2; because of the isolation, two mechanisms are required to perform full equalization of sense amplifier 4 prior to sensing, as without the isolation feature, equalization of the bit lines would equalize the sensing nodes as well.

It should be noted that clock signals CLK, CLK_, AMP_, E, and E_ are generated within the memory device, and that their timing, relative to the generation of the voltage on the selected one of word lines 16, and relative to each other, may be optimized, using techniques well-known in the art, to achieve maximum sense amplifier sensitivity and minimum sense amplifier power dissipation, is dependent upon the bit line capacitance and other physical factors inherent in each memory device utilizing the invention. The sequence of operation of the above-described sense amplifier, utilizing the invention, will show such an optimized timing sequence.

Figure 3:
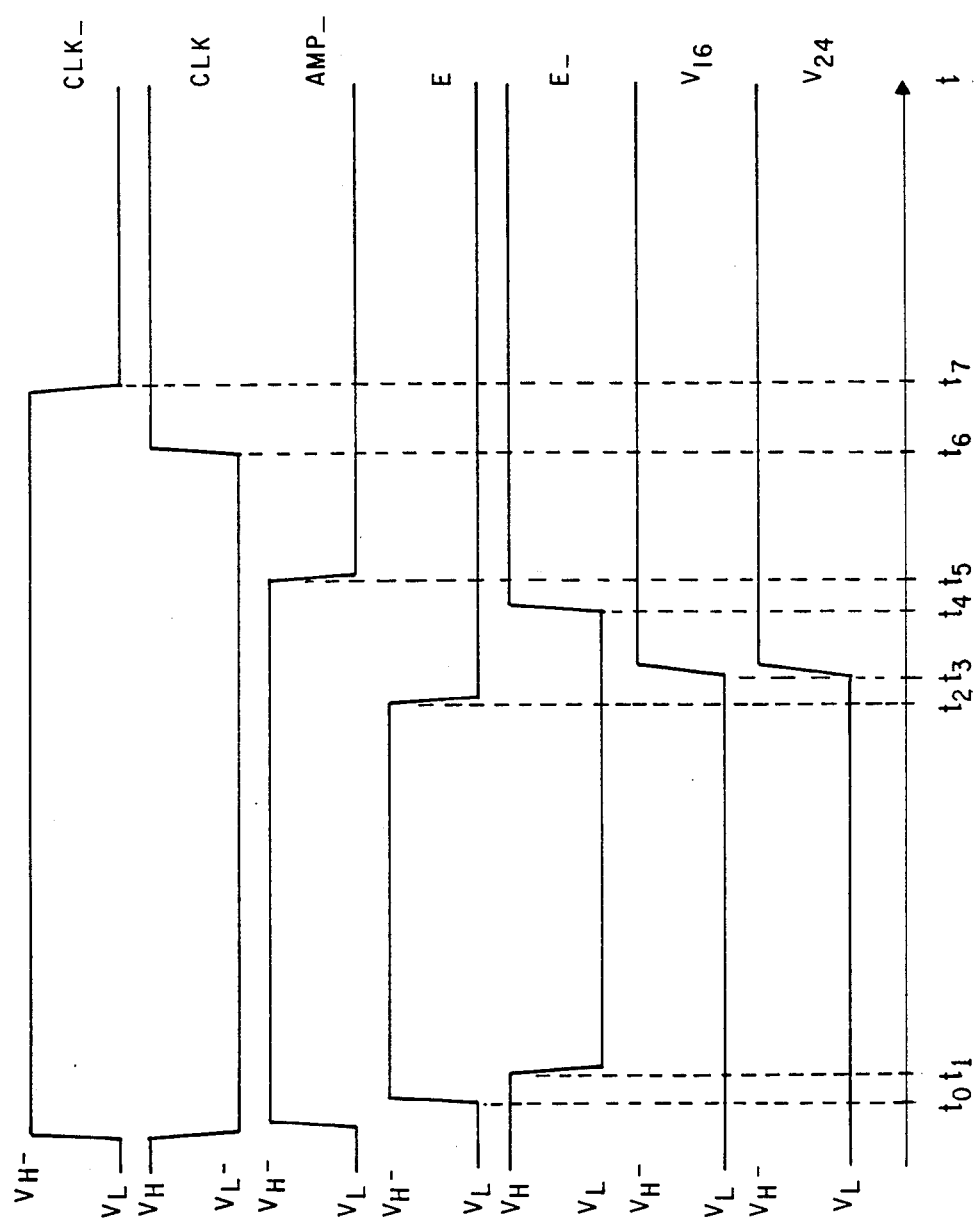
FIG. 3 is a timing diagram of the clock signals presented to the sense amplifier of FIG. 2 during operation.
Figure 4:
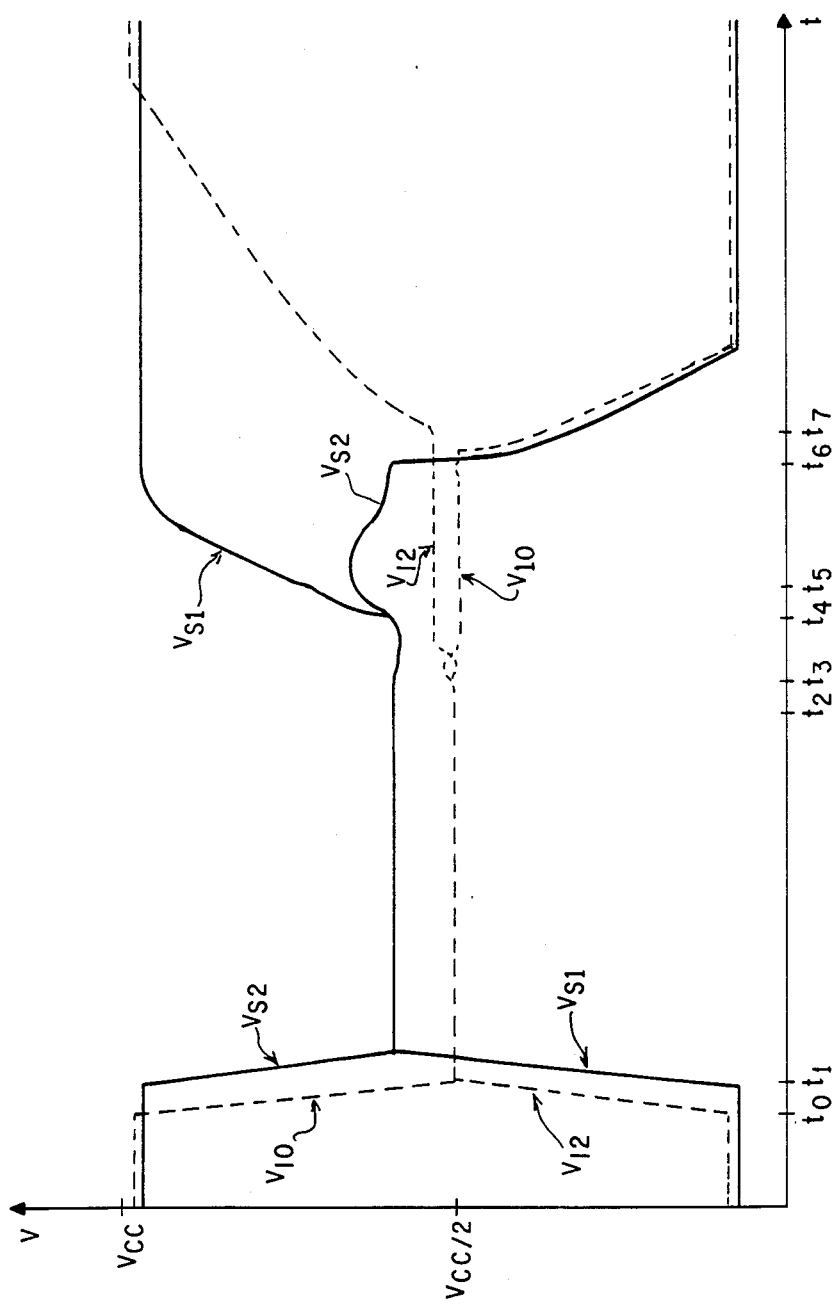
FIG. 4 is a timing diagram illustrating the response of various nodes in the sense amplifier of FIG. 2 to the clock signals of FIG. 3.

Referring now to FIGS. 3 and 4, the operation of the preferred embodiment of the invention shown in FIG. 2 will be explained in detail. Prior to the connection of storage capacitor 2 to bit line 10, i.e., during the precharge period of the device, the voltages on word line 16 and dummy word line 24 are at a low level, placing transfer gate 14 and dummy transfer gate 21 in a non-conductive state. Clock signal CLK is at this time driven to a low logic level, and clock signal CLK_ is driven to a high logic level, thereby disconnecting node SC from $V_{cc}$ and node SN from ground, respectively. In addition, clock signal AMP_ is taken to a high level, thereby also disconnecting node SCC from $V_{cc}$. This point in time is at the instant immediately preceding time $t_0$ in FIG. 3.

At this point in the memory cycle, shown in FIGS. 3 and 4 as time $t_0$, equalization of bit lines 10 and 12 relative to each other, and sensing nodes S1 and S2 relative to each other, can occur. Clock signal E is taken high, causing transistors 60 to conduct and thereby allowing the voltage of bit line 10, shown in FIG. 4 as V10, and the voltage of bit line 12, shown in FIG. 4 as V12, to equalize at approximately $V_{cc}/2$. Concurrently with, or subsequent to, the transition of clock signal E to its high level, clock signal E_ is driven to a low level, causing p-channel transistor 62 to conduct, thereby causing the voltage of sensing node S1, shown in FIG. 4 as VS1, and the voltage of sensing node S2, shown in FIG. 4 as VS2, to equalize. It should be noted that if clock signal E_ is driven low before clock signal E is driven high, one of the sensing nodes S1 or S2 will be at a low voltage (depending upon whether bit line 10 or bit line 12 was driven to a low voltage in the prior cycle), preventing transistor 62 from conducting if the absolute value of the gate-to-source voltage of transistor 62 does not exceed the threshold voltage, thereby precluding proper equalization of sensing nodes S1 and S2 even when clock signal E is subsequently driven high. However, if clock signal E is driven high prior to clock signal E_ being driven low, bit lines 10 and 12 will tend toward $V_{cc}/2$ prior to the connection of sensing nodes S1 and S2 together, thereby allowing transistor 62 to properly equalize the voltage of sensing nodes S1 and S2 also at approximately $V_{cc}/2$. It is therefore preferable that the timing be designed such that clock signal E_ is driven low subsequent to clock signal E being driven high, in order to ensure that, under all operating conditions, transistor 62 will properly conduct. FIG. 3 shows clock signal E_ going low at time $t_1$, subsequent to clock signal E going high at time $t_0$, with the voltages of sensing nodes S1 and S2, shown in FIG. 4 as VS1 and VS2, equalizing in response to clock signal E_ going to its low level. It should further be noted that the equalization of bit lines 10 and 12, and of sensing nodes S1 and S2, can occur either during the precharge portion of the memory cycle or during the beginning of the active portion of the memory cycle, as long as such equalization is completed prior to the energizing of word line 16 or dummy word line 24.

After equalization is accomplished, clock signal E is driven to a low level shortly before the voltage on word line 16 is driven by row decoder 18 to a high level, and before the voltage on dummy word line 24 is driven to a high level. In FIG. 3, clock signal E is shown going to its low level at time $t_2$, shortly before the voltages of word line 16 and dummy word line 24, shown in FIG. 3 as V16 and V24, respectively, are driven to a high voltage at time $t_3$. This is necessary in order to ensure that the differential voltage between bit lines 10 and 12 is not destroyed by having the bit lines shorted together by transistors 60. It is preferable, though, that clock signal E_ be held low for a brief time after word line 16 and dummy word line 24 are driven high, since the differential bit line voltage is not necessarily monotonic, as shown in FIG. 4, due to parasitic reactances and other second-order effects; if clock signal E_ were taken high too early, the sensing nodes S1 and S2 could sense an incorrect data state if the differential voltage changes polarity prior to reaching its stabilized value. After this brief period of time, when the differential voltage is likely to be at a stable polarity, clock signal E_ is taken to a high level (at time $t_4$ in FIG. 3), thereby disconnecting sensing node S1 from sensing node S2, ad allowing a differential voltage to be established between sensing nodes S1 and S2 in response to the differential voltage between bit lines 10 and 12, as shown in FIG. 4.

As discussed above, once word line 16 and dummy word line 24 are driven to a high level, transfer gate 14 and dummy transfer gate 21 are energized, thereby connecting the top plate of storage capacitor 2 to bit line 10, and the top plate of dummy capacitor 20 to bit line 12, respectively. After the brief delay discussed above, clock signal E_ is then taken to its high state. Clock signal AMP_ is brought low a brief period of time after clock signal E_ is driven high, as shown in FIG. 3 as occurring at time $t_5$, in order to pull node SCC to $V_{cc}$ through transistor 40. One of transistors 30 or 32 will then conduct, dependent upon whether bit line 10 has a lower or higher voltage than bit line 12, which of course depends upon the presence or absence of charge on storage capacitor 2 relative to dummy capacitor 20, i.e., the data state of the memory cell represented by storage capacitor 2. By way of example, assuming that a "0" state (i.e., the presence of negative charge, or the absence of positive charge) is stored by storage capacitor 2, the voltage V10 of bit line 10 will be low relative to the voltage V12 of bit line 12, causing transistor 30 to be more conductive relative to transistor 32. This will cause sensing node S1 to rise toward $V_{cc}$ faster than sensing node S2, as shown in FIG. 4 subsequent to time $t_5$.

If node SN is at a level at least one n-channel transistor threshold voltage below sensing nodes S1 and S2, regenerative feedback will occur since sensing nodes S1 and S2 are connected to the gates of n-channel transistors 36 and 34, respectively. In the example illustrated in FIG. 3, with sensing node S1 being pulled toward $V_{cc}$ through transistor 30, transistor 36 will conduct if node SN is a threshold voltage below sensing node S1. This will pull sensing node S2 toward the low level of node SN, ensuring that transistor 34 is non-conductive, and allowing the voltage at sensing node S1 to be pulled toward $V_{cc}$ without reduction via transistor 34, which in turn reinforces the conductive state of transistor 36. In FIG. 4, the regenerative feedback is illustrated by voltage VS2 falling between time $t_5$ and time $t_6$. Once the regenerative feedback has amplified the differential voltage at sensing nodes S1 and S2, clock signal CLK is brought high, shown occurring at time $t_6$ of FIG. 3, causing transistor 38 to conduct, pulling node SN to ground, and latching the amplified differential voltage at sensing nodes S1 and S2, as shown in FIG. 4 subsequent to time $t_6$. It is preferable to delay clock signal CLK relative to clock signal AMP__, so that the differential voltage between sensing nodes S1 and S2 is amplified sufficiently to ensure that the sensing node associated with the higher voltage bit line (in this example, sensing node S2) is sufficiently discharged before node SN is pulled to ground. In this example, if clock signal CLK is energized before sensing node S2 is sufficiently discharged, transistor 56 (as well as transistor 52) will be conductive when node SN is pulled to ground, discharging the voltage of bit line 12, and thereby destroying the differential voltage between bit lines 10 and 12. Finally, at time $t_7$ in the cycle, clock signal CLK__ is taken to a low level, pulling node SC toward $V_{cc}$ through transistor 58, and allowing the CMOS inverter comprised of transistors 50 and 52 to drive bit line 10 to a low level. Since the gates of transistors 50 and 52 (i.e., sensing node S1) are at a high level, causing transistor 52 to conduct and transistor 50 to not conduct, the low level is restored to storage capacitor 2. It should also be noted that bit line 12 is similarly driven high by the CMOS inverter comprised of transistors 54 and 56; this action is not used to charge dummy capacitor 20, since dummy capacitor 20 is otherwise restored (by circuitry not shown), independently of the logic state of storage capacitor 2. An example of circuitry for so restoring the proper dummy capacitor charge is disclosed in U.S. Pat. No. 4,547,868. Of course, transistors 54 and 56 will perform the restoring function for storage capacitors 2 associated with bit line 12, as shown in FIG. 1, when these cells are addressed.

However, even if the voltage at node SN is not an n-channel transistor threshold voltage below the voltage at sensing nodes S1 and S2 at the point in the cycle prior to clock signal CLK going high, the circuit will still amplify the differential voltage between bit line 10 and bit line 12 without the operation of the regenerative feedback discussed above. This is because sensing node S1 will rise to the voltage at node SCC (i.e., toward $V_{cc}$ through transistor 40) faster than will sensing node S2, even without transistor 36 pulling sensing node S2 toward node SN, since the lower voltage of bit line 10 relative to bit line 12 causes transistor 30 to be more conductive than transistor 32. As long as clock signal CLK goes high prior to sensing node S2 being fully charged to the voltage at node SCC, sensing node S1 will be at a higher voltage than sensing node S2 when clock signal CLK goes high, and the amplification and latching of the sensed differential voltage will properly occur.

It should be noted that the capacitance of sensing nodes S1 and S2 is significantly less than the capacitance of bit lines 10 and 12. This is illustrated in FIG. 4 by comparing the time constant of VS1 subsequent to time $t_4$ to the time constant of V12 subsequent to time $t_7$. Since bit lines 10 and 12 are not directly connected to sensing nodes S1 and S2, but instead drive the gates of transistors 30 and 32, respectively, the capacitances associated with bit lines 10 and 12 are isolated from sensing nodes S1 and S2, thereby allowing sensing nodes S1 and S2 to settle to the proper logic states faster than if the bit line capacitances were so connected. As a result, the amplification of the differential voltage between bit lines 10 and 12 occurs much faster in a sense amplifier constructed according to the invention than in current sense amplifiers using CMOS inverters which are cross-coupled in the traditional sense.

Although the invention has been described in detail herein with reference to its preferred embodiment, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A sense amplifier circuit for sensing the differential voltage between a first bit line and a second bit line, said first and second bit lines each having a capacitance, comprising:
   a first coupling means for coupling said first bit line to a first sensing node in such a manner that the voltage of said first sensing node is responsive to the voltage of said first bit line and in such a manner that the capacitance of said first bit line is isolated from said first sensing node;
   a second coupling means for coupling said second bit line to a second sensing node in such a manner that the voltage of said second sensing node is responsive to the voltage of said second bit line and in such a manner that the capacitance of said first bit line is isolated from said first sensing node;
   amplifying means for amplifying the differential voltage between said first sensing node and said second sensing node, responsive to said first bit line and said second bit line being at different voltages;
   a first driving means for driving said first bit line to a voltage responsive to said amplifying means, said driving means coupled between said first bit line and said amplifying means in such a manner that the capacitance of said first bit line is isolated from said amplifying means for either polarity of differential voltage; and
   a second driving means for driving said second bit line to a voltage responsive to said amplifying means, said driving means coupled between said second bit line and said amplifying means in such a manner that the capacitance of said second bit line is isolated from said amplifying means for either polarity of differential voltage.

2. The sense amplifier circuit of claim 1, wherein said first coupling means comprises:
   a first transistor having a gate connected to said first bit line, and having a source-to-drain path connected between a bias voltage node and said first sensing node;
   wherein said second coupling means comprises:
   a second transistor having a gate connected to said second bit line, and having a source-to-drain path connected between said bias voltage node and said second sensing node;

wherein said first transistor is more conductive than said second transistor if the differential voltage between said first bit line and said second bit line in of a predetermined polarity, and said second transistor is more conductive than said first transistor if the differential voltage between said first bit line and said second bit line is of the polarity opposite from said predetermined polarity;

and wherein said amplifying means comprises:

means for connecting said bias voltage node to a first power supply; and latch means for maintaining the relative voltages of said first and second sensing nodes subsequent to said first power supply being connected to said bias voltage node, so that if the differential voltage between said first bit line and said second bit line is of said predetermined polarity, said first sensing node is maintained at a voltage closer to said first power supply than said second sensing node, and so that if the differential voltage between said first bit line and said second bit line is of said opposite polarity, said second sensing node is maintained at a voltage closer to said first power supply than said first sensing node.

3. The sense amplifier circuit of claim 1, wherein said first driving means has an input connected to said first sensing node and has an output connected to said first bit line, for driving said first bit line to an amplified differential voltage, of the original polarity, relative to the voltage of said second bit line; and wherein said second driving means has an input connected to said second sensing node and has an output connected to said second bit line, for driving said second bit line to an amplified differential voltage, of the original polarity, relative to the voltage of said first bit line.

4. The sense amplifier circuit of claim 3, wherein said first coupling means comprises:

a first transistor having a gate connected to said first bit line, and having a source-to-drain path connected between a bias voltage node and said first sensing node;

wherein said second coupling means comprises:

a second transistor having a gate connected to said second bit line, and having a source-to-drain path connected between said bias voltage node and said second sensing node;

wherein said first transistor is more conductive than said second transistor if the differential voltage between said first bit line and said second bit line is of a predetermined polarity, and said second transistor is more conductive than said first transistor if the differential voltage between said first bit line and said second bit line is of the polarity opposite from said predetermined polarity;

and wherein said amplifying means comprises:

means for connecting said bias voltage node to a first power supply; and latch means for maintaining the relative voltages of said first and second sensing nodes subsequent to said first power supply being connected to said bias voltage node, so that if the differential voltage between said first bit line and said second bit line is of said predetermined polarity, said first sensing node is maintained at a voltage closer to said first power supply than said second sensing node, and so that if the differential voltage between said first bit line and said second bit line is of said opposite polarity, said second sensing node is maintained at a voltage closer to said first power supply than said first sensing node.

5. The sense amplifier circuit of claim 1, further comprising:

a first equalizing means for connecting said first sensing node to, and subsequently disconnecting said first sensing node from, said second sensing node prior to such time as the differential voltage between said first bit line and said second bit line is to be sensed, thereby equalizing the voltages of said first and second sensing nodes prior to the respective coupling of the voltages of said first and second bit lines thereto.

6. The sense amplifier circuit of claim 5, further comprising:

a second equalizing means for connecting said first bit line to, and subsequently disconnecting said first bit line from, said second bit line prior to such time as the differential voltage between said first bit line and said second bit line is to be sensed, thereby equalizing the voltages of said bit lines prior to said differential voltage being established on said bit lines.

7. The sense amplifier circuit of claim 6, wherein said second equalizing means connects said first bit line to said second bit line prior to said first equalizing means connecting said first sensing node to said second sensing node.

8. An amplifier for sensing the differential voltage between a first stored voltage and a second stored voltage, comprising:

a first connecting means for connecting the first stored voltage to a first input node, said first input node having a capacitance;

a second connecting means for connecting the second stored voltage to a second input node, said second input node having a capacitance;

a transistor network, comprising:

a first transistor, having a gate connected to said first input node and having a source-to-drain path connected between a first bias node and a first sensing node;

a second transistor, having a gate connected to said second input node, and having a source-to-drain path connected between said first bias voltage node and a second sensing node;

a third transistor, having a gate connected to said second sensing node, and having a source-to-drain path connected between a second bias voltage node and said first sensing node; and a fourth transistor, having a gate connected to said firs sensing node, and having a source-to-drain path connected between said second bias voltage node and said second sensing node so that responsive to said first and second connecting means connecting said first stored voltage to said first input node, and said second stored voltage to said second input node, respectively, said transistor network energizes said first and second sensing nodes to a differential voltage;

a first inverter, having an input connected to said first sensing node and having an output connected to said first input node; and a second inverter, having an input connected to said second sensing node and having an output connected to said second input node;

wherein, responsive to said transistor network energizing said first and second sensing nodes to a differential voltage, said first and second inverters energize said first and second input nodes to a differential voltage having a polarity consistent with the differential voltage between said first and second stored voltages prior to their connection to said first and second input nodes by said first and second connecting means.

9. The amplifier of claim 8, further comprising:
a third connecting means for connecting said first bias voltage node to a first power supply;
a fourth connecting means for connecting said second bias voltage node to a second power supply, said second power supply having a voltage different from the voltage of the first power supply;
wherein, subsequent to said first and second connecting means connecting the first and second stored voltages to said first and second input nodes, respectively, said third connecting means connects said first bias voltage node to said first power supply and said fourth connecting means connects said second bias voltage node to said second power supply.

10. The amplifier of claim 9, wherein said fourth connecting means connects said second power supply to said second bias voltage node after said third connecting means connects said first power supply to said first bias voltage node.

11. The amplifier of claim 8, further comprising:
a fifth transistor, having a source-to-drain path connected between said first sensing node and said second sensing node;
means for generating a first equalization signal, having an output connected to the gate of said fifth transistor, wherein said first equalization signal is generated prior to said first and second connecting means connecting said first and second stored voltages to said first and second input nodes, respectively, thereby allowing the voltages of said first and second sensing nodes to equalize prior to the sensing of the first and second stored voltages.

12. The amplifier of claim 11, further comprising:
a sixth transistor, having a source-to-drain path connected between said first input node and a reference node;
a seventh transistor, having a source-to-drain path connected between said second input node and said reference node; and
means for generating a second equalization signal, having an output connected to the gates of said sixth and seventh transistors, wherein said second equalization signal is generated prior to said first and second connecting means connecting said first and second stored voltages to said first and second input nodes, respectively, thereby allowing the voltages of said first and second input nodes to equalize to the voltage of said reference node prior to the sensing of the first and second stored voltages.

13. The amplifier of claim 12, wherein said means for generating said second equalization signal generates said second equalization signal before said means for generating said first equalization signal generates said first equalization signal.

14. The amplifier of claim 8, wherein said first inverter comprises:

a first inverter transistor, having a gate connected to said first sensing node, and having a source-to-drain path connected between a third bias voltage node and said first input node; and
a second inverter transistor, having a gate connected to said first sensing node, and having a source-to-drain path connected between said second bias voltage node and said first input node, said second inverter transistor having a channel conductivity type opposite that of said first inverter transistor;
and wherein said second inverter comprises:
a third inverter transistor, having a gate connected to said second sensing node, and having a source-to-drain path connected between said third bias voltage node and said second input node; and
a fourth inverter transistor, having a gate connected to said second sensing node, and having a source-to-drain path connected between said second bias voltage node and said second input node, said fourth inverter transistor having a channel conductivity type opposite that of said third inverter transistor.

15. The amplifier of claim 8, wherein said first and second transistors are of the same channel-conductivity type;
wherein said third and fourth transistors are of the same channel-conductivity type;
wherein said first and third transistors are of opposite channel-conductivity type;
and wherein said second and fourth transistors are of opposite channel-conductivity type.

16. In a sense amplifier for sensing the differential voltage between a first bit line and a second bit line, said sense amplifier comprised of a first CMOS inverter and a second CMOS inverter, both inverters biased between a first bias voltage node and a second bias voltage node, each of said first and second CMOS inverters having an upper and a lower transistor of opposite channel-conductivity type, the improvement comprising:
a first coupling means for connecting said first bit line to the gate of the upper transistor in said first CMOS inverter;
a second coupling means for connecting said second bit line to the gate of the upper transistor in said second CMOS inverter;
a third coupling means for connecting the common node between the upper and lower transistors in said first CMOS inverter to the gate of the lower transistor in said second CMOS inverter;
a fourth coupling means for connecting the common node between the upper and lower transistors in said second CMOS inverter to the gate of the lower transistor in said first CMOS inverter;
a third CMOS inverter having an upper transistor and having a lower transistor, said lower transistor being of opposite channel-conductivity type from said upper transistor, said third CMOS inverter being biased between a third bias voltage node and said second bias voltage node, the gates of said upper and lower transistors of said third CMOS inverter connected to the common node of said first CMOS inverter; and
a fourth CMOS inverter having an upper transistor and having a lower transistor, said lower transistor being of opposite channel-conductivity type from said upper transistor, said fourth CMOS inverter being biased between said third bias voltage node and said second bias voltage node, the gates of said upper and lower transistors of said fourth CMOS inverter connected to the common node of said second CMOS inverter;

wherein the upper transistor of said first CMOS inverter is more conductive than the upper transistor of said second CMOS inverter if the differential voltage between said first bit line and said second bit line is of a predetermined polarity, and wherein the upper transistor of said second CMOS inverter is more conductive than the upper transistor of said first CMOS inverter if the differential voltage between said first bit line and said second bit line is of the polarity opposite from said predetermined polarity, so that the common nodes of said first and second CMOS inverters will be energized to a differential voltage relative to each other responsive to a differential voltage between said first bit line and said second bit line.

* * * * *